(12) United States Patent
Tseng et al.

(10) Patent No.: US 10,515,833 B2
(45) Date of Patent: Dec. 24, 2019

(54) WAFER CLEANING SYSTEM AND METHOD

(71) Applicant: Taiwan Semiconductor Manufacturing Co., Ltd, Hsin-Chu (TW)

(72) Inventors: Kuo-Shu Tseng, New Taipei (TW); Yao-Yuan Shang, Taichung (TW); You-Feng Chen, Taichung (TW)

(73) Assignee: TAIWAN SEMICONDUCTOR MANUFACTURING CO., LTD, Hsin-Chu, Taiwan (CN)

( * ) Notice: Subject to any disclaimer, the term of this patent is extended or adjusted under 35 U.S.C. 154(b) by 1251 days.

(21) Appl. No.: 14/163,045

(22) Filed: Jan. 24, 2014

(65) Prior Publication Data

US 2015/0214027 A1 Jul. 30, 2015

(51) Int. Cl.
*H01L 21/02* (2006.01)
*H01L 21/67* (2006.01)

(52) U.S. Cl.
CPC .. *H01L 21/67253* (2013.01); *H01L 21/67046* (2013.01)

(58) Field of Classification Search
CPC .... B08B 1/04; B08B 3/12; B08B 1/00; H01L 21/0209; H01L 21/67046; H01L 21/681; H01L 21/67253; H01L 21/6838; B24B 9/065; Y10S 414/136; Y10S 414/141
USPC .......... 15/77, 88.3, 21.1, 102; 134/902; 414/936
See application file for complete search history.

(56) References Cited

U.S. PATENT DOCUMENTS

| | | | |
|---|---|---|---|
| 6,842,932 B2* | 1/2005 | Ishihara | B08B 1/04 15/102 |
| 7,803,231 B2* | 9/2010 | Katano | B08B 1/008 134/18 |
| 8,578,953 B2* | 11/2013 | Takiguchi | H01L 21/67028 134/149 |
| 2013/0112223 A1* | 5/2013 | Nakaharada | H01L 21/67046 134/18 |

* cited by examiner

*Primary Examiner* — Joseph J Hail
*Assistant Examiner* — Arman Milanian
(74) *Attorney, Agent, or Firm* — McClure, Qualey & Rodack, LLP

(57) ABSTRACT

Embodiments of a wafer cleaning system and method are provided. A brush element is configured to clean a backside of the wafer. The backside has a clear area and an unclear area, and some contaminants are located in the unclear area. A control device performs a first cleaning process to the brush element when the brush element is located at the clear area, and the control device performs a second cleaning process when the brush element is located at the unclear area. The contaminants are cleaned by an enhanced cleaning process. Since the contaminants are cleaned, the backside of the wafer is flatter, and quality of the exposed photoresist on the wafer is improved.

19 Claims, 9 Drawing Sheets

WAFER CLEANING SYSTEM AND METHOD

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

In the lithography process, a photoresist is applied to a wafer. The photoresist is a material that forms a pattern when it is exposed to radiation. A thin layer of the photoresist is spread on the surface of a wafer, and the photoresist is exposed to form a pattern in the semiconductor manufacturing process. These patterns now have very fine details, and some issues in the photoresist may cause an unsatisfactory image in the exposed photoresist. Although existing devices and methods for lithography processing have been generally adequate for their intended purposes, they have not been entirely satisfactory in all respects. Consequently, it would be desirable to provide a solution for improving the quality of the exposed photoresist.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It should be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. It is understood that additional operations can be provided before, during, and after the method, and some of the operations described can be replaced or eliminated for other embodiments of the method.

In general, contaminants can adhere to the backside of a wafer. If the contaminants having great size are not removed, the wafer may be tilted or the height of the wafer is increased due to the contaminants. The wafer may not be exposed accurately by an exposure apparatus, and the quality of the exposed photoresist on the wafer may be decreased. Therefore, the present disclosure provides wafer cleaning systems and methods to remove the contaminants that adhere to the backside of the wafer.

Figure 1:
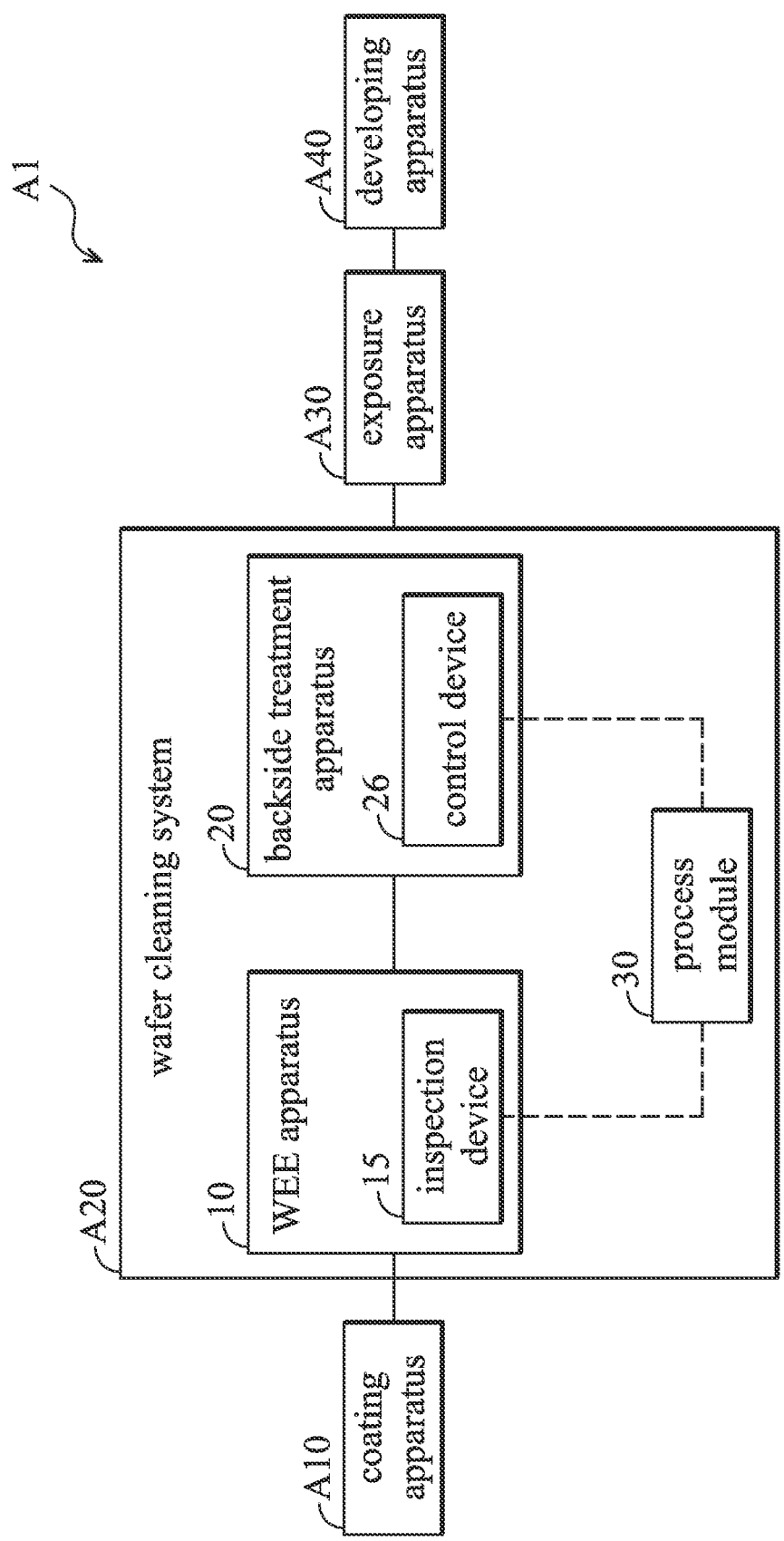
FIG. 1 is a schematic view of a lithography system in accordance with some embodiments of the disclosure.

FIG. 1 is a schematic view of a lithography system A1 in accordance with some embodiments of the disclosure. The lithography system A1 includes a coating apparatus A10, a wafer cleaning system A20, an exposure apparatus A30, and a developing apparatus A40. The coating apparatus A10 is configured to coat a photoresist on a wafer by a coating process. The wafer cleaning system A20 includes a wafer edge exposure (WEE) apparatus 10, a backside treatment apparatus 20, and a process module 30.

The wafer is transmitted to the WEE apparatus 10 after the coating process. The WEE apparatus 10 is configured to remove the photoresist at the edge of the wafer by a WEE process. Afterwards, the wafer is transmitted to the backside treatment apparatus 20 after the WEE process. The backside treatment apparatus 20 is configured to clean the backside of the wafer by a cleaning process.

The wafer is transmitted to the exposure apparatus A30 after the cleaning process. The exposure apparatus A30 is configured to form a patterned photoresist by an exposure process. Finally, the wafer is transmitted to the developing apparatus A40 after the exposure process. The developing apparatus A40 is configured to remove the unmasked areas of the patterned photoresist. Afterwards, the wafer is transmitted to perform another semiconductor manufacturing process, such as an etching process or a chemical vapor deposition (CVD) process.

Figure 2A:
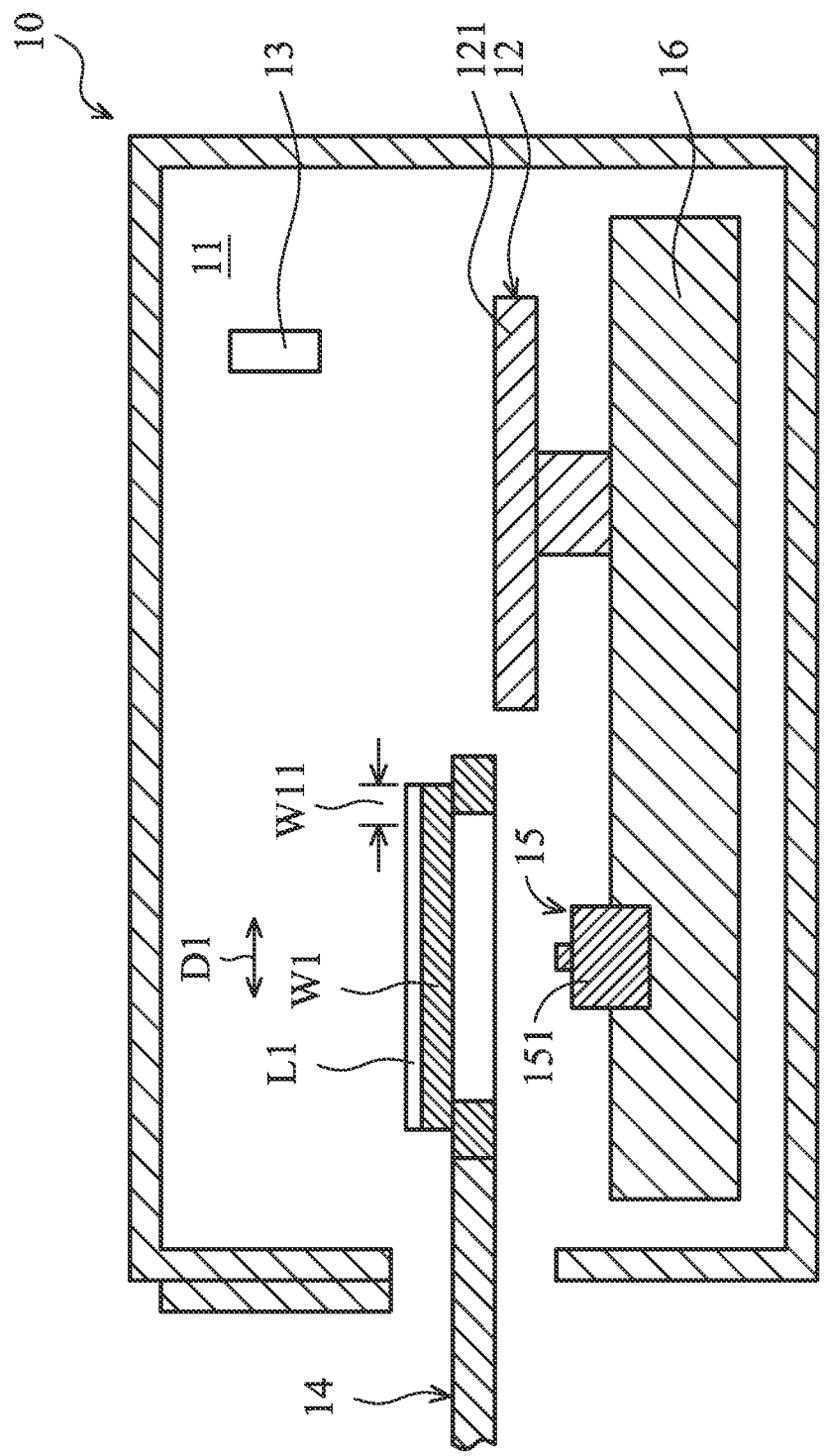
FIGS. 2A and 2B are schematic views of a wafer edge exposure (WEE) apparatus in accordance with some embodiments of the disclosure.
Figure 2B:
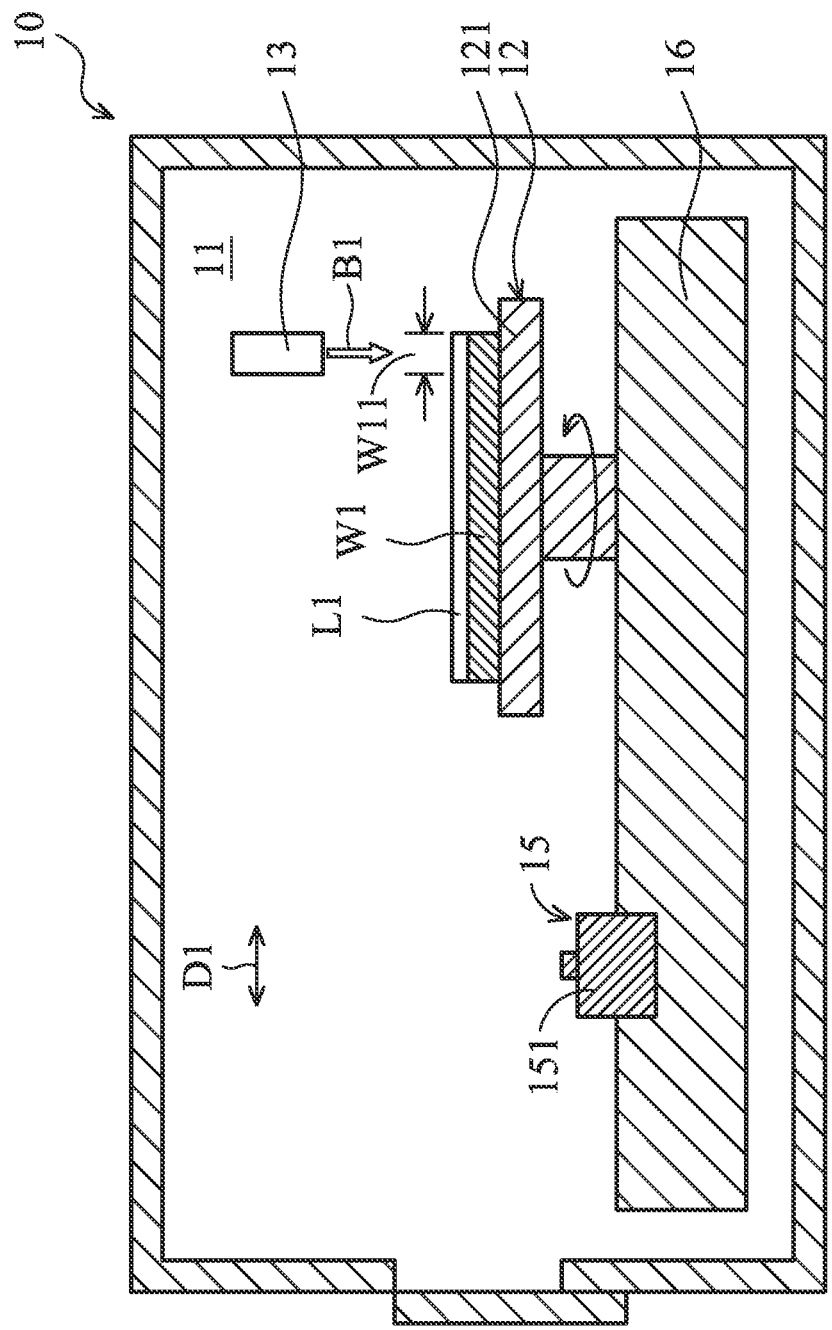
Figure 3:
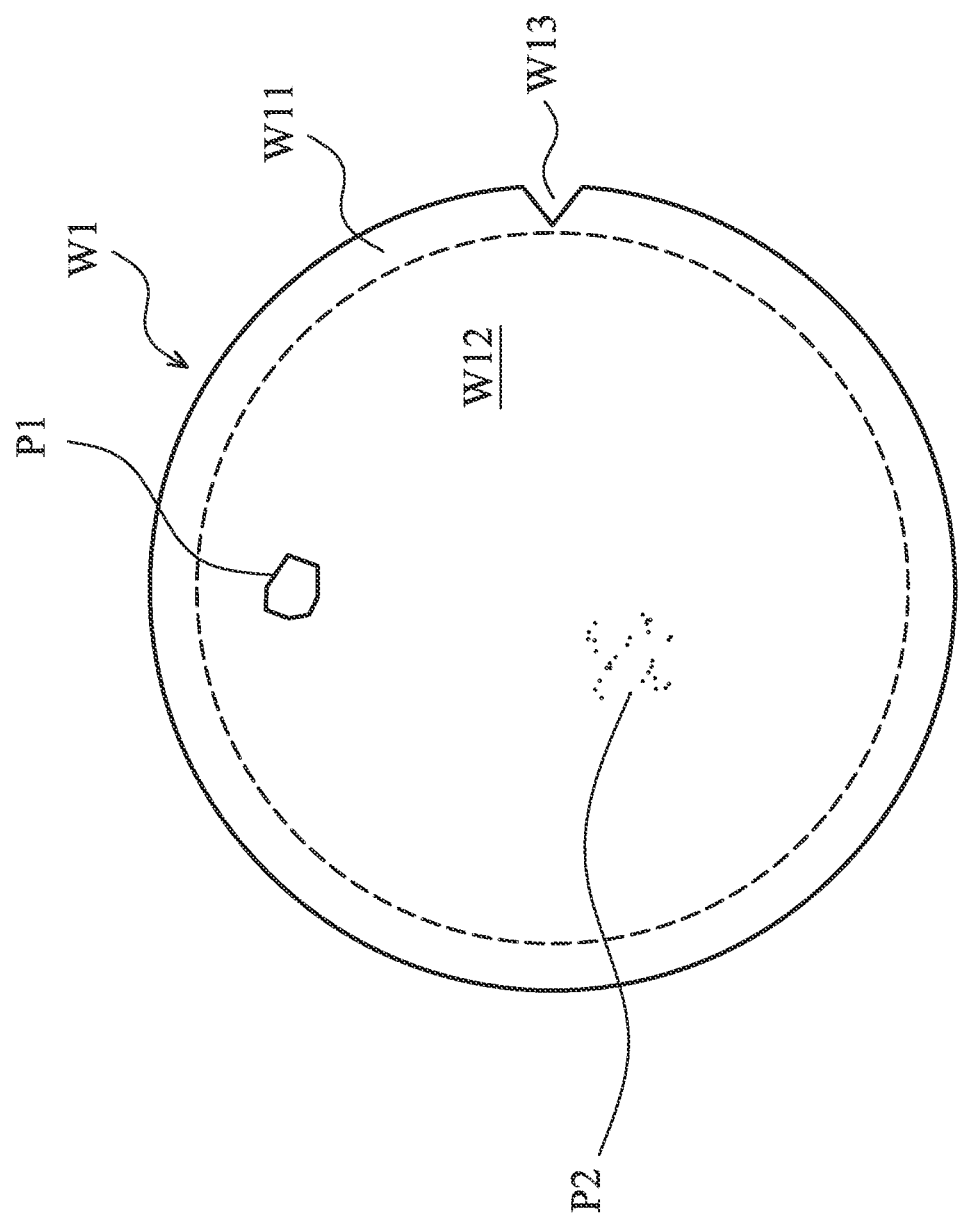
FIG. 3 is a bottom view of a wafer in accordance with some embodiments of the disclosure.

FIGS. 2A and 2B are schematic views of the WEE apparatus 10 in accordance with some embodiments of the disclosure. FIG. 3 is a bottom view of a wafer W1 in accordance with some embodiments of the disclosure. The WEE apparatus 10 includes an exposure chamber 11, a wafer chuck device 12, an exposure device 13, a wafer arm 14, an inspection device 15, and a base 16.

The wafer chuck device 12 is disposed in the exposure chamber 11. The wafer chuck device 12 is configured to retain the wafer W1. A photoresist layer L1 is overlaid on the wafer W1. The wafer chuck device 12 includes a rotation chuck 121. The rotation chuck 121 is configured to rotate the wafer W1.

The exposure device 13 is located over the wafer chuck device 12 in the exposure chamber 11. The exposure device 13 is configured to emit an energy beam on an edge W11 of the wafer W1.

The wafer arm 14 is configured to transmit the wafer W1 to the wafer chuck device 12. The wafer W1 is selectively located over the inspection device 15 or the wafer chuck device 12 by the wafer arm 14.

The inspection device 15 is disposed in the exposure chamber 11. The inspection device 15 is configured to inspect a backside W12 of the wafer. In some embodiments, the inspection device 15 includes a camera 151. The camera 151 is configured to capture an image of the backside W12 of the wafer W1.

The base 16 is disposed in the exposure chamber 11. In some embodiments, the base 16 is configured to support the wafer chuck device 12 and the inspection device 15. In other words, the wafer chuck device 12 and the inspection device 15 are disposed on the base 16.

When the WEE process is performed, the wafer W1 is retained by the wafer arm 14. Afterwards, the wafer arm 14 is moved toward the wafer chuck device 12 along a moving direction D1. When the wafer W1 is located over the inspection device 15, the wafer arm 14 stops moving in a predetermined time. In some embodiments, the predetermined time is in a range from about 1 second to about 10 seconds. When the wafer arm 14 is stopped, the inspection device 15 inspects the backside W12 of the wafer W1 and generates an inspection signal to the process module 30. In some embodiments, the camera 151 of the inspection device 15 captures an image of the backside W12 of the wafer W1.

Afterwards, the wafer W1 is disposed on the wafer chuck device 12 by the wafer arm 14. As shown in FIG. 2B, the wafer W1 is rotated by the wafer chuck device 12. The exposure device 13 emits an energy beam B1 onto the edge W11 of the wafer W1. Since the wafer W1 is rotated, the energy beam B1 is emitted onto the wafer W1 along a circular path. The photoresist layer L1 emitted by the energy beam B1 is removed.

As shown in FIG. 1, the process module 30 is electrically connected to the inspection device 15. In some embodiments, the process module 30 is a computer. The process module 30 is configured to generate a control signal according to the inspection signal. As shown in FIG. 3, some contaminants P1 and P2 adhere on the backside W12 of the wafer W1. In some embodiments, the process module 30 analyzes the coordinates and the areas of the contaminants P1 and P2 according to the inspection signal.

In some embodiments, the wafer W1 has a notch W13 as shown in FIG. 3. The process module 30 analyzes the position relative to the contaminants P1 and P2 and the notch W13 according to the inspection signal, and therefore, the coordinates of the contaminants P1 and P2 relative to the notch W13 are determined. In some embodiments, the process module 30 generates a control signal to the control device 26 according to the areas and the coordinates obtained from the inspection signal.

Figure 4:
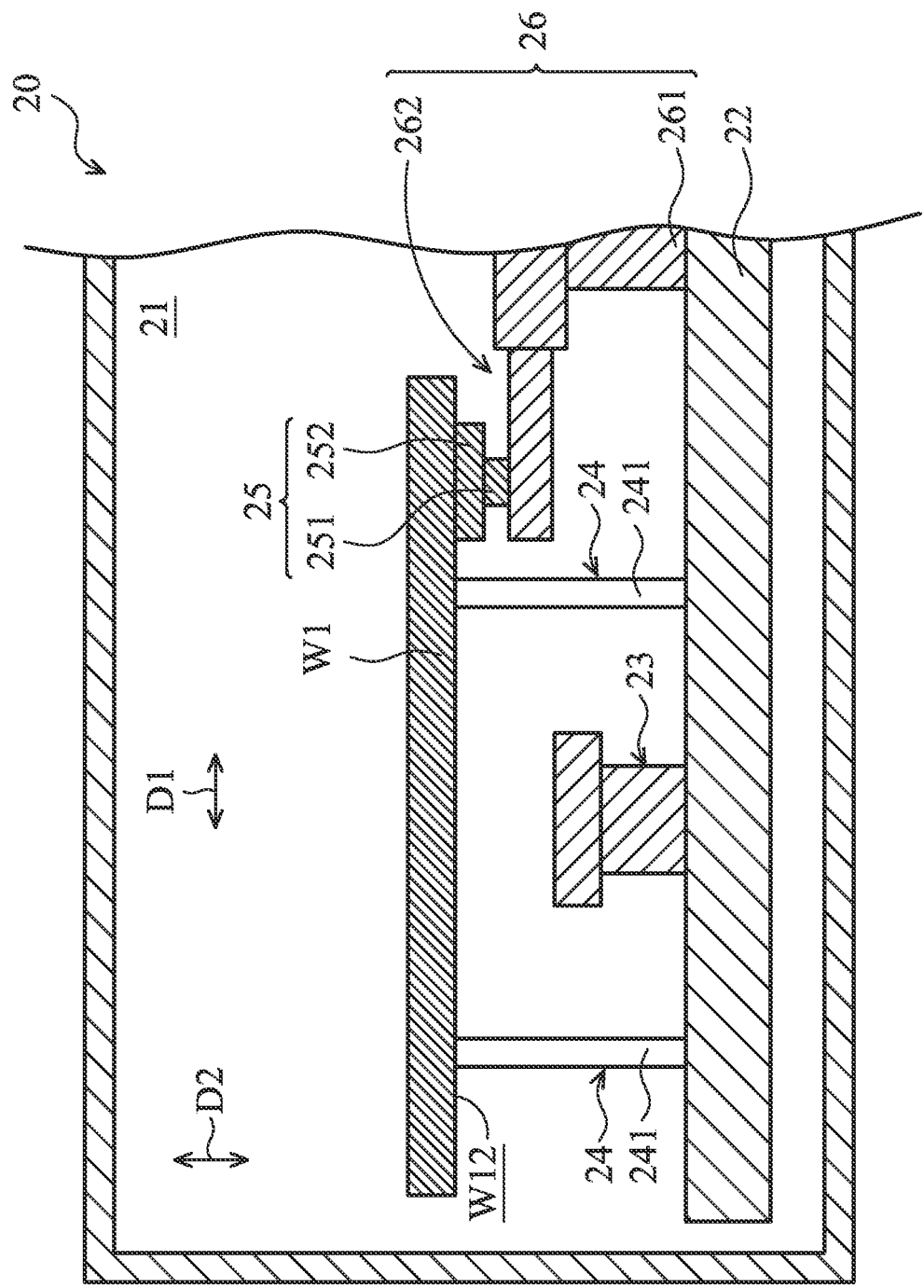
FIG. 4 is a schematic view of the backside treatment apparatus during a cleaning process in accordance with some embodiments of the disclosure.

FIG. 4 is a schematic view of the backside treatment apparatus 20 during a cleaning process in accordance with some embodiments of the disclosure. The wafer W1 in the WEE apparatus 10 in FIGS. 2A and 2B is transformed to the backside treatment apparatus 20. The backside treatment apparatus 20 includes a cleaning chamber 21, a base 22, a spin device 23, a pin device 24, a brush element 25 and a control device 26. The base 22 is disposed in the cleaning chamber 21.

The base 22 is configured to support the spin device 23, the pin device 24, and the control device 26. The spin device 23 is disposed on the base 22 in the cleaning chamber 21. The spin device 23 is configured to rotate the wafer W1 when the wafer W1 is disposed on the spin device 23.

The pin device 24 is disposed on the base 22 in the cleaning chamber 21. The pin device 24 is configured to elevate the wafer W1. The pin device 24 includes pins 241. The pins 241 are moveable along an elevating direction D2.

The brush element 25 is disposed on the control device 26. The brush element 25 is configured to contact and clean the backside W12 of the wafer W1. The brush element 25 includes a brush holder 251 and a brush head 252. The brush holder 251 is disposed on the control device 26. The brush head 252 is configured to rotate on the brush holder 251. The brush head 252 is configured to contact and clean the backside W12 of the wafer W1.

The control device 26 is disposed on the base 22 in the cleaning chamber 21. The control device 26 is configured to control the movement of the brush element 25 according to the control signal. In some embodiments, the control device 26 includes an elevating mechanism 261 and a moving arm 262. In some embodiments, the elevating mechanism 261 is disposed on the base 22 in the cleaning chamber 21. The elevating mechanism 261 is configured to elevate the moving arm 262 along the elevating direction D2. In some embodiments, the elevating mechanism 261 is also configured to move the moving arm 262 along a horizontal plane. In some embodiments, the moving arm 262 is configured to move the brush element 25 along the moving direction D1.

When a cleaning process is performed, the pins 241 are raised. In some embodiments, the height of the top of the pins 241 of the pin device 24 relative to the base 22 is higher than the height of the top of the spin device 23. Therefore, the wafer W1 is distant from the spin device 23. In other words, the backside W12 of the wafer W1 does not contact the spin device 23.

Figure 5:
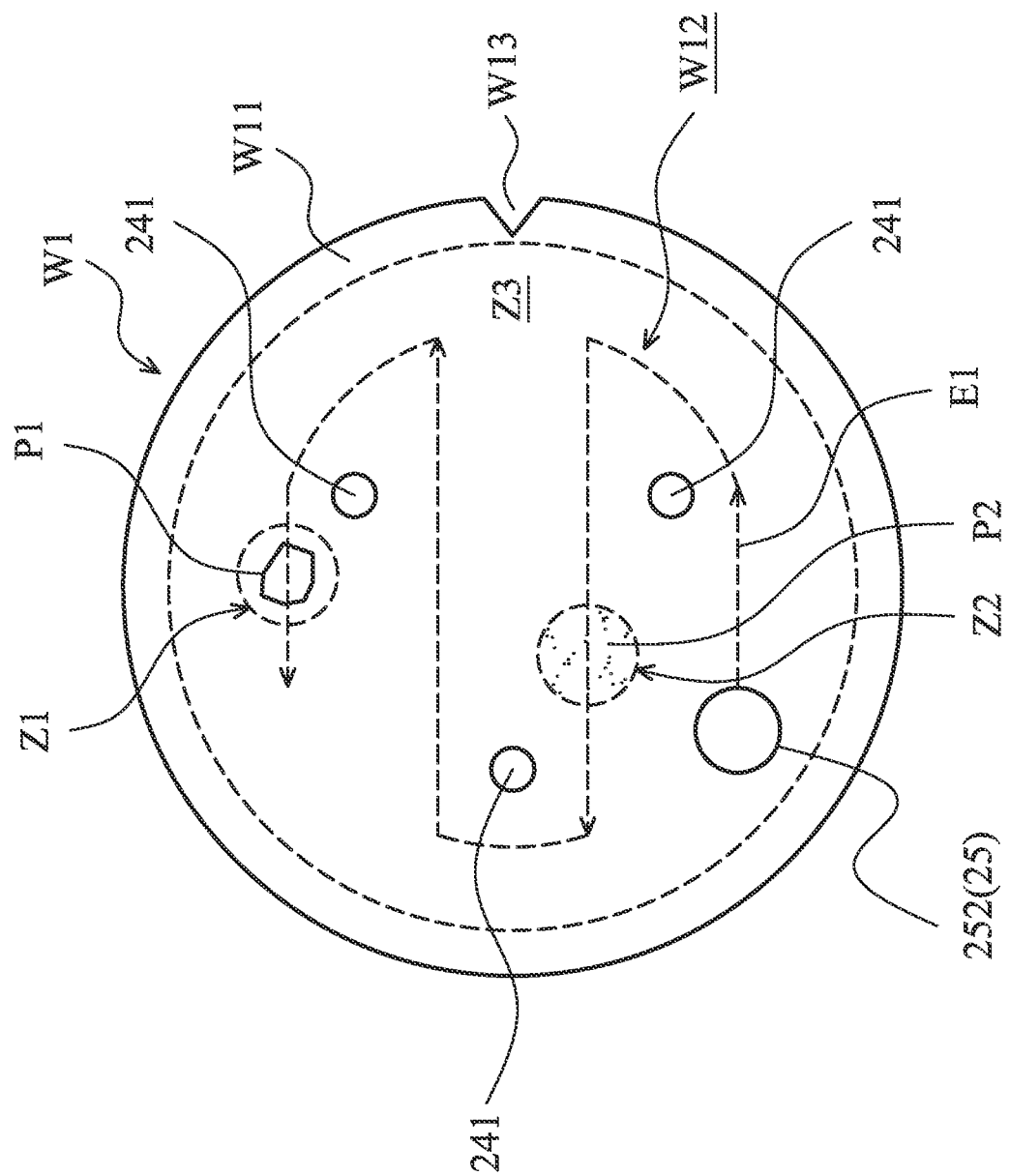
FIG. 5 is a schematic view of the wafer, the pins, and the brush head in accordance with some embodiments of the disclosure.

FIG. 5 is a schematic view of the wafer W1, the pins 241, and the brush head 252 in accordance with some embodiments of the disclosure. As shown in FIG. 5, the backside W12 of the wafer W1 has unclear areas Z1 and Z2, and a clear area Z3. The contaminant P1 is located in the unclear area Z1, and the contaminant P2 is located in the unclear area Z2. In some embodiments, the clear area Z3 is defined as an area excluded from the unclear areas Z1 and Z2 on the backside W12 of the wafer W1. There are no (or few) contaminants detected on the clear area Z3.

As shown in FIGS. 4 and 5, the control device 26 moves the brush element 25 along a first path E1. The brush element 25 is moved along the first path E1 to clean the unclear areas Z1 and Z2 and the clear area E3. In some embodiments, the contaminant P1 is a mass structure, and the contaminant P2 includes one or a number of particles. The area of the mass structure is greater than the area of each of the particles. In general, the contaminant P1 is more difficult to clean off than the contaminant P2.

If the unclear areas Z1 and Z2 and the clear area E3 are cleaned by the same cleaning process, the contaminant P1 and/or the contaminant P2 may remain on the backside W12 of the wafer W1. Therefore, the control device 26 control the brush element 25 to clean the backside W12 of the wafer W1 according to a general cleaning process (first cleaning process) when the brush element 25 is located at the clear area Z3, and the control device 26 control the brush element 25 to clean the backside W12 of the wafer W1 according to an enhanced cleaning process (second cleaning process) when the brush element 25 is located at the unclear areas Z1 and Z2.

In some embodiments, the brush element 25 at the unclear area Z1 has a first movement speed in a range from about 3 mm/s to about 5 mm/s during the enhanced cleaning process. The brush element 25 at the unclear area Z2 has a second movement speed in a range from about 5 mm/s to about 10 mm/s during the enhanced cleaning process. The brush element 25 at the clear area Z3 has a third movement speed in a range from about 10 mm/s to about 20 mm/s during the general cleaning process.

The first movement speed of the brush element 25 is slower than the second movement speed. The third movement speed is greater than the first movement speed and the second movement speed. Therefore, the contaminants P1 and P2 are cleaned by enhanced cleaning.

In some embodiments, the first rotational speed of the brush head 252 at the unclear area Z1 is in a range from about 1.5 r/s to about 1.8 r/s during the enhanced cleaning process. The second rotational speed of the brush head 252 at the unclear area Z2 is in a range from about 1.2 r/s to about 1.5 r/s during the enhanced cleaning process. The third rotational speed of the brush head 252 at the clear area Z3 is in a range from about 0.8 r/s to about 1.0 r/s during the general cleaning process.

For the same purpose, the first rotational speed of the brush element 25 is greater than the second rotational speed. The third rotational speed is slower than the first rotational speed and the second rotational speed.

In some embodiments, the brush head 252 of the brush element 25 stays at the unclear area Z1 during a first pause period during the enhanced cleaning process. The first pause period is in a range from about 10 seconds to about 15 seconds during the enhanced cleaning process. In some embodiments, the brush head 252 stays at the unclear area Z2 during a second pause period. The second pause period is in a range from about 5 seconds to about 10 seconds. The first pause period of the unclear area Z1 is longer than the second pause period. Furthermore, the brush head 252 is rotated during the pause period.

Furthermore, the brush head 252 is raised by the control device 26 to apply a force to the wafer W1 according the control signal. In some embodiments, the brush head 252 applies a first force to the wafer W1 at the unclear area Z1 in a range from about 23 nt to about 25 nt during the enhanced cleaning process. The brush head 252 applies a second force to the wafer W1 at the unclear area Z2 in a range from about 20 nt to about 23 nt during the enhanced cleaning process. The brush head 252 applies a third force to the wafer W1 at the clear area Z3 in a range from about 15 nt to about 20 nt during the general cleaning process. For the same purpose, the first force is greater than the second force. The third force is lower than the first force and the second force.

Figure 6:
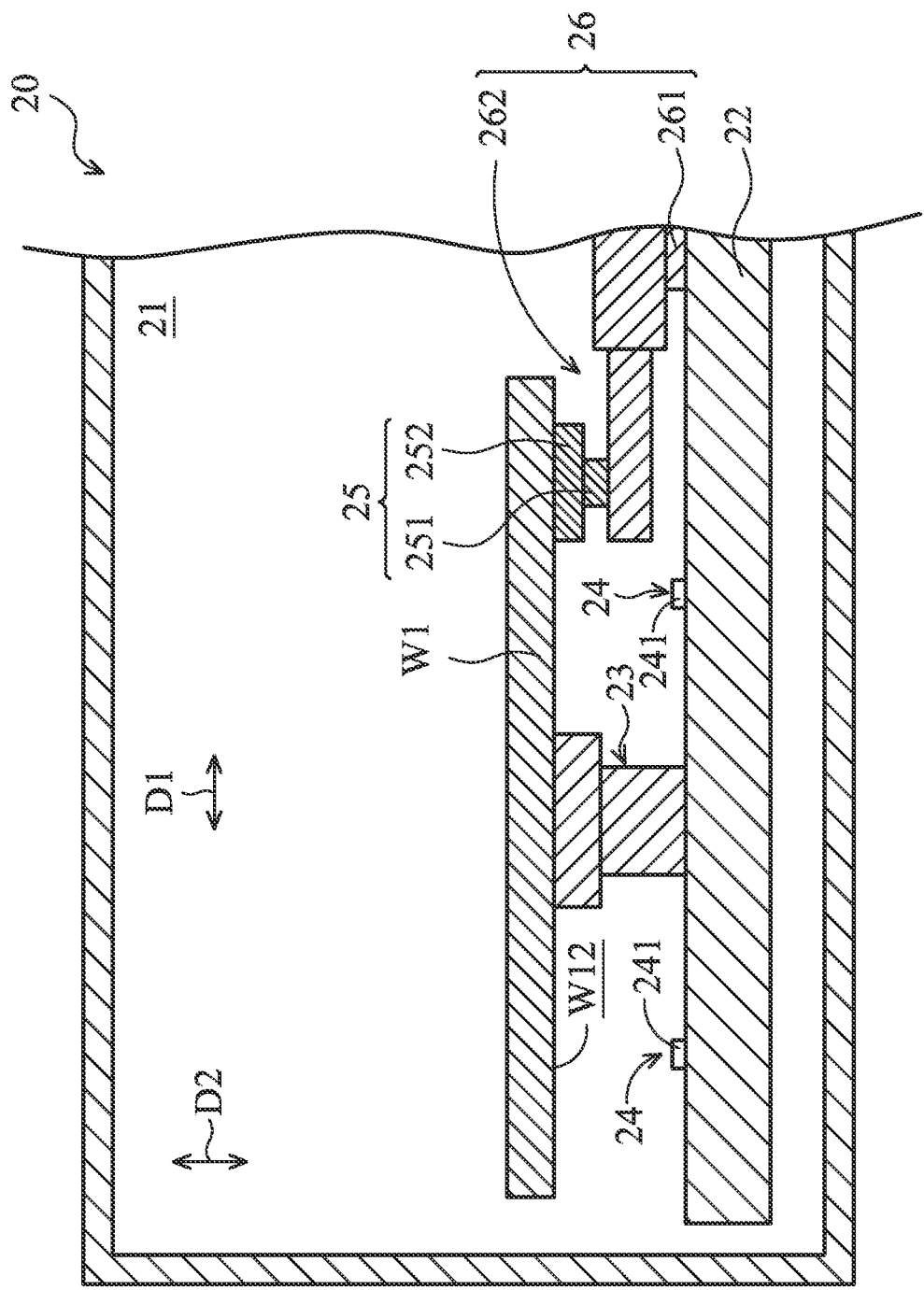
FIG. 6 is a schematic view of the backside treatment apparatus during a cleaning process in accordance with some embodiments of the disclosure.

FIG. 6 is a schematic view of the backside treatment apparatus 20 during a cleaning process in accordance with some embodiments of the disclosure. FIG. 6 is similar to FIG. 4, and in FIG. 6, the pins 241 are descended, and the wafer W1 is put on the spin device 23. In some embodiments, the height of the top of the pins 241 of the pin device 24 relative to the base 22 is shorter than the height of the top of the spin device 23. Therefore, the wafer W1 is distant from the pins 241. In other words, the backside W12 of the wafer W1 does not contact the pins 241.

Figure 7:
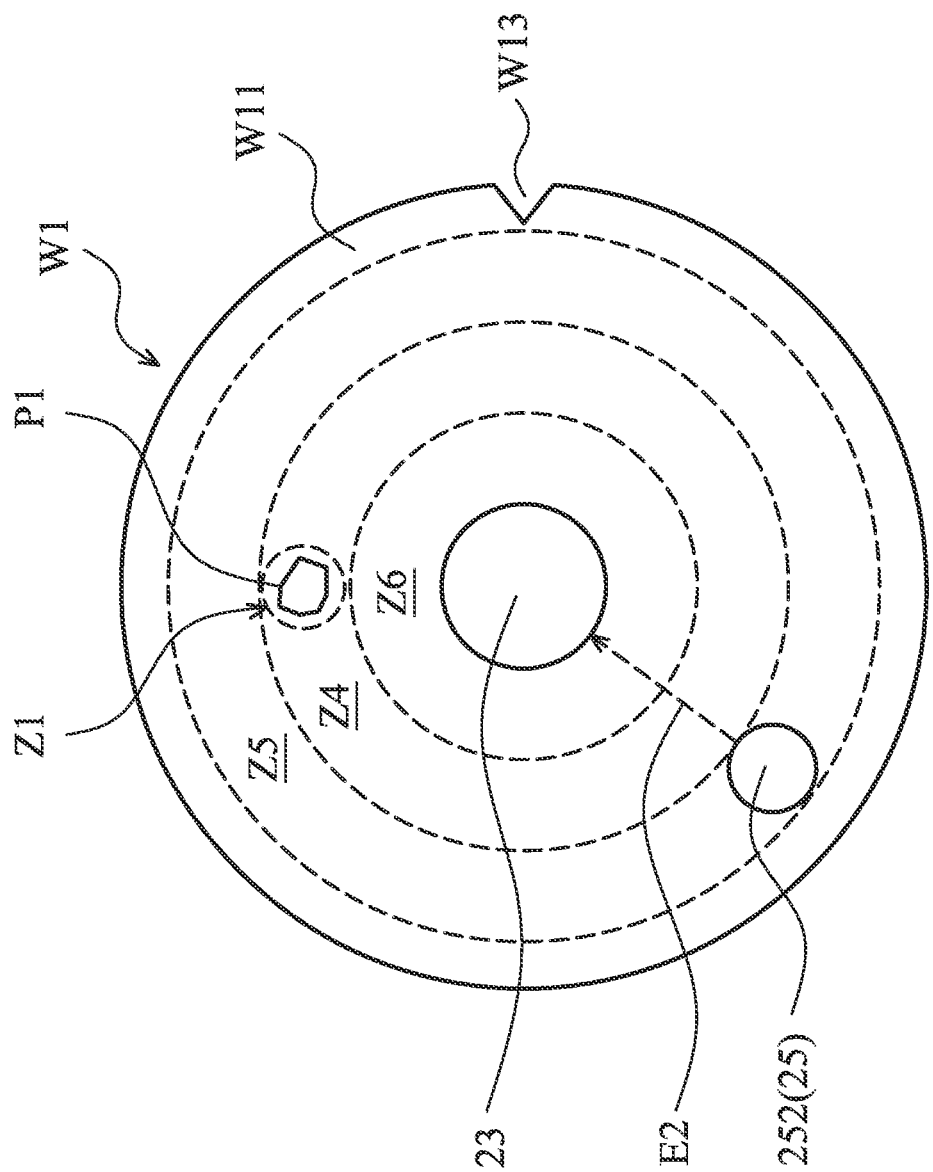
FIG. 7 is a schematic view of the wafer, the spin device, and the brush head in accordance with some embodiments of the disclosure.

FIG. 7 is a schematic view of the wafer W1, the spin device 23, and the brush head 252 in accordance with some embodiments of the disclosure. As shown in FIGS. 6 and 7, the backside W12 of the wafer W1 has an unclear area Z4, and clear areas Z5 and Z6. In some embodiments, the unclear area Z4, and the clear areas Z5 and Z6 are concentric circles. The contaminants P1 are located in the unclear area Z4. In some embodiments, the clear areas Z5 and Z6 are defined as an area excluded from the unclear area Z4 on the backside W12 of the wafer W1.

When the wafer W1 is rotated by the spin device 23, the brush element 25 is moved from the edge W11 of the wafer W1 toward the center of the wafer W1 along a second path E2. In the embodiments, the second path E2 is a straight line.

In some embodiments, the rotational speed of the wafer W1 is in a range from about 1000 rpm to about 2000 rpm during the enhanced cleaning process when the brush element 25 is at the unclear area Z4. The rotational speed of the wafer W1 is in a range from about 2000 rpm to about 3000 rpm during the enhanced cleaning process when the brush element 25 is at the clear areas Z5 and Z6. The rotational speed of the wafer W1 when the brush element 25 is at the unclear area Z4 is slower than the rotational speed of the wafer when the brush element is at the clear areas Z5 and Z6.

In some embodiments, the movement speed of the brush element 25 at the unclear area Z4 is in a range from about 5 mm/s to about 8 mm/s during the enhanced cleaning process. The movement speed of the brush element 25 at the clear areas Z5 and Z6 is in a range from about 7 mm/s to about 10 mm/s during the enhanced cleaning process. The movement speeds of the brush element 25 at the unclear area Z4 is slower than the movement speed of the brush element 25 at the clear areas Z5 and Z6.

In some embodiments, the rotational speed of the brush head 252 at the unclear area Z4 is in a range from about 1.5 r/s to about 1.8 r/s during the enhanced cleaning process. The rotational speeds of the brush head 252 at the clear areas Z5 and Z6 are in a range from about 0.8 r/s to about 1.0 r/s during the general cleaning process. The rotational speed of the brush element 25 at the unclear area Z4 is greater than the rotational speeds of the brush head 252 at the clear areas Z5 and Z6.

In some embodiments, the brush head 252 of the brush element 25 stays at the unclear area Z4 during a pause period. The pause period is in a range from about 5 seconds to about 15 seconds. Furthermore, the brush head 252 is rotated during the pause period.

In some embodiments, the brush head 252 applies a force to the wafer W1 at the unclear area Z4 in a range from about 20 nt to about 25 nt during the enhanced cleaning process. The brush head 252 applies a force to the wafer W1 at the clear areas Z5 and Z6 in a range from about 15 nt to about 20 nt during the general cleaning process. The force applied to the unclear area Z4 by the brush head 252 is greater than the force applied to the clear areas Z5 and Z6.

Figure 8:
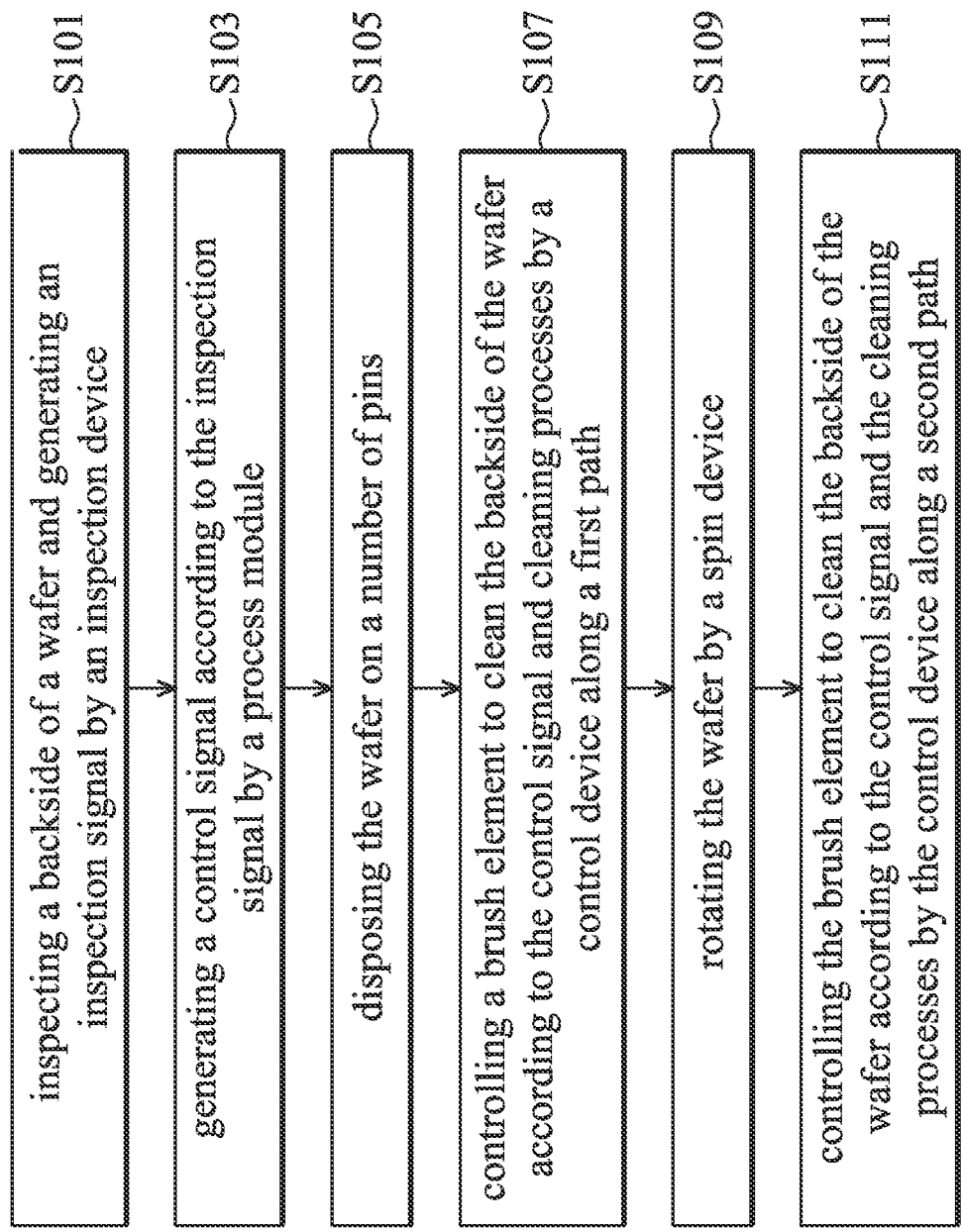
FIG. 8 is a flow chart of a wafer cleaning method in accordance with some embodiments of the disclosure.

FIG. 8 is a flow chart of a wafer cleaning method in accordance with some embodiments of the disclosure. In step S101, the wafer W1 is disposed in the WEE apparatus 10 as shown in FIGS. 2A and 2B. The backside W12 of the wafer W1 is inspected by the inspection device 15. The inspection device 15 generates an inspection signal to the process module 30.

In step S103, the process module 30 receives and analyzes the inspection signal from the inspection device 15. In some embodiments, the process module 30 defines the coordinates of the contaminants P1 and P2 on the backside W12 of the wafer W1. Furthermore, the process module 30 analyzes the areas of the contaminants P1 and P2.

Afterwards, the process module 30 generates a control signal according to the inspection signal. In some embodiments, the process module 30 generates a control signal according to the coordinates and the areas of the contaminants P1 and P2. In some embodiments, the control signal includes movement information according to the coordinates and the areas of the contaminants P1 and P2. In some embodiments, the movement information includes path data, movement speed data, rotation data, and force data.

In step S105, the wafer W1 is transformed to the backside treatment apparatus 20 as shown in FIG. 4. The wafer W1 is disposed on the pins 241. In step S107, the control device 26 receives the control signal, and controls the brush element 25 to clean the backside W12 of the wafer W1 according to the control signal and cleaning processes along a first path E1 (as shown in FIG. 5).

In some embodiments, the control device 26 controls the brush element 25 to contact the backside W12 of the wafer W1 at a predetermined position. The predetermined position may be close to the edge W11 of the wafer. Furthermore, the control device 26 controls the brush element 25 to move on the backside W12 of the wafer W1 along the first path E1 path according to the path data.

In some embodiments, the control device 26 adjusts the movement speed of the brush element 25 at different positions of the path according to the movement speed data. The control device 26 adjusts the rotational speed of the brush element 25 at different positions of the path according to the rotation data. The control device 26 adjusts the force of the brush element 25 contacting the backside W12 of the wafer W1 at different positions of the path according to the force data.

Furthermore, the control device 26 performs the first cleaning process to clean the backside W12 of the wafer W1 when the brush element 25 is located at a clear area. In some embodiments, the control device 26 controls the brush element 25 to clean the backside W12 of the wafer W1 according to the first cleaning process when the brush element 25 is located at a clear area. The control device 26 performs the second cleaning process to clean the backside W12 of the wafer W1 when the brush element 25 is located at an unclear area. In some embodiments, the control device 26 controls the brush element 25 to clean the backside W12 of the wafer W1 according to the second cleaning process when the brush element 25 is located at an unclear area by the control device 26.

In step S109, the wafer W1 is rotated by the spin device 23 as shown in FIG. 6. In step S111, the control device 26 controls the brush element 25 to clean the backside W12 of the wafer W1 along a second path E2 (as shown in FIG. 7) according to the control signal and the cleaning processes as described in step S107.

In some embodiments, the control device 26 adjusts a movement speed of the brush element 25 to a first movement speed according to the first cleaning process. The control device 26 adjusts a movement speed of the brush element 25 to a second movement speed according to the second cleaning process. In some embodiments, the second movement speed is slower than the first movement speed.

In some embodiments, the control device 26 stops the brush element 25 moving at the unclear area during a pause period according to the second cleaning process.

In some embodiments, the control device 26 adjusts a rotational speed of a brush head 252 of the brush element 25 to a first rotational speed according to the first cleaning process. The control device 26 adjusts a rotational speed of the brush head 252 to a second rotational speed according to the second cleaning process. In some embodiments, The second rotational speed of the brush head 252 is greater than the first rotational speed of the brush head 252.

In some embodiments, the control device 26 adjusts a force of the brush head 252 applying to the wafer W1 to a first force according to the first cleaning process. The control device 26 adjusts a force of the brush head 252 applying to the wafer W1 to a second force according to the second cleaning process. In some embodiments, the second force is greater than the first force.

In some embodiments, the control device 26 adjusts a rotational speed of the wafer W1 to a first rotational speed according to the first cleaning process. The control device 26 adjusts a rotational speed of the wafer W1 to a second rotational speed according to the second cleaning process. In some embodiments, the second rotational speed of the wafer is slower than the first rotational speed of the wafer.

Embodiments of a wafer cleaning system and method are provided. A brush element is configured to clean a backside of the wafer. The backside has a clear area and an unclear area, and some contaminants are located in the unclear area. A control device performs a first cleaning process to the brush element when the brush element is located at the clear area, and the control device performs a second cleaning process when the brush element is located at the unclear area. The contaminants are cleaned by an enhanced cleaning process. Since the contaminants are cleaned, the backside of the wafer is flatter. The wafer is not tilted and the height of the wafer is not increased due to the contaminants. Therefore, the wafer is exposed accurately by an exposure apparatus, and the quality of the exposed photoresist on the wafer is improved.

In some embodiments, a wafer cleaning system for cleaning contaminants on a wafer is provided. The wafer cleaning system includes a spin device configured to rotate the wafer, and a brush element configured to clean a backside of the wafer. The wafer cleaning system also includes a control device configured to control the brush element. The backside has a clear area and an unclear area, and the contaminants are located in the unclear area. The control device controls the brush element to clean the backside of the wafer according to a first cleaning process when the brush element is located at the clear area, and the control device controls the brush element to clean the backside of the wafer according to a second cleaning process when the brush element is located at the unclear area.

In some embodiments, a wafer cleaning method for cleaning contaminants on a wafer is provided. The wafer cleaning method includes inspecting a backside of the wafer and generating an inspection signal by an inspection device, and generating a control signal according to the inspection signal by a process module. The wafer cleaning method also includes controlling a brush element to clean the backside of the wafer according to the control signal by a control device. The wafer cleaning method further includes performing a first cleaning process when the brush element is located at a clear area, and performing a second cleaning process when the brush element is located at an unclear area.

In some embodiments, a wafer cleaning method for cleaning contaminants on a wafer is provided. The wafer cleaning method includes inspecting the backside of the wafer and generating an inspection signal by an inspection device and generating a control signal according to the inspection signal by a process module. The wafer cleaning method also includes disposing the wafer on a number of pins, and controlling a brush element to clean the backside of the wafer according to the control signal by a control device along a first path. The wafer cleaning method further includes rotating the wafer by a spin device, and controlling the brush element to clean the backside of the wafer according to the control signal by the control device along a second path.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A wafer cleaning system for cleaning contaminants on a wafer, comprising:
   a spin device configured to support the wafer;
   a brush element comprising a brush holder movable relative to the wafer chuck, and a brush head configured to rotate on the brush holder;
   a control device configured to control the brush element;
   a wafer arm configured to transport the wafer, wherein an opening is formed on the wafer arm;
   an inspection device configured to inspect a backside of the wafer and generate an inspection signal, wherein the inspection device inspects the backside of the wafer through the opening of the wafer arm; and
   a process module configured to generate a control signal according to the inspection signal, wherein the control device is configured to control a movement speed of the brush element, a rotational speed of the brush head, or a rotational speed of the spin device, according to the control signal, while the brush element is moving along a predetermined path.

2. The wafer cleaning system as claimed in claim 1, wherein the backside of the wafer has a clear area and an unclear area, and the contaminants are located in the unclear area, wherein a movement speed of the brush element at the unclear area is slower than a movement speed of the brush element at the clear area.

3. The wafer cleaning system as claimed in claim 1, wherein the backside of the wafer has a clear area and an unclear area, and the contaminants are located in the unclear area, wherein a rotational speed of the brush head at the unclear area is greater than a rotational speed of the brush head at the clear area.

4. The wafer cleaning system as claimed in claim 1, wherein the backside of the wafer has a clear area and an unclear area, and the contaminants are located in the unclear area, wherein a rotational speed of the spin device when the brush element is at the unclear area is slower than a rotational speed of the spin device when the brush element is at the clear area.

5. The wafer cleaning system as claimed in claim 1, further comprising:
   a cleaning chamber, wherein the spin device and the brush element are positioned in the cleaning chamber;
   an exposure chamber secluded from the cleaning chamber; and
   a wafer chuck device disposed in the exposure chamber;
   wherein the inspection device is disposed in the exposure chamber and positioned adjacent to the wafer chuck device.

6. The wafer cleaning system as claimed in claim 5, wherein the inspection device comprises a camera configured to capture an image of the backside of the wafer.

7. The wafer cleaning system as claimed in claim 1, further comprising:
   a plurality of pins configured to support the wafer, wherein the spin device is configured to rotate the wafer; and when the wafer is disposed on the pins, the wafer is distant from the spin device.

8. A wafer cleaning system for cleaning contaminants on a wafer, comprising:
   a spin device configured to rotate the wafer;
   a brush element comprising a brush holder movable relative to the wafer, and a brush head configured to rotate on the brush holder;
   a control device configured to control the brush element;
   a cleaning chamber, wherein the spin device and the brush element are positioned in the cleaning chamber;
   a wafer arm configured to transport the wafer, wherein an opening is formed on the wafer arm;
   an inspection device positioned outside the cleaning chamber and configured to inspect a backside of the wafer and generate an inspection signal, wherein the inspection device inspects the backside of the wafer through the opening of the wafer arm; and
   a process module configured to generate a control signal according to the inspection signal, wherein the control device is configured to control the brush element according to the control signal.

9. The wafer cleaning system as claimed in claim 8, wherein the backside of the wafer has a clear area and an unclear area, and the contaminants are located in the unclear area, wherein a movement speed of the brush element at the unclear area is slower than a movement speed of the brush element at the clear area.

10. The wafer cleaning system as claimed in claim 8, wherein the backside of the wafer has a clear area and an unclear area, and the contaminants are located in the unclear area, wherein a rotational speed of the brush head at the unclear area is greater than a rotational speed of the brush head at the clear area.

11. The wafer cleaning system as claimed in claim 8, wherein the backside of the wafer has a clear area and an unclear area, and the contaminants are located in the unclear area, wherein a rotational speed of the spin device when the brush element is at the unclear area is slower than a rotational speed of the spin device when the brush element is at the clear area.

12. A wafer cleaning system for cleaning contaminants on a wafer, comprising:

a spin device configured to rotate the wafer;

a brush element comprising a brush holder movable relative to the wafer, and a brush head configured to rotate on the brush holder;

a control device configured to control the brush element or the spin device;

a cleaning chamber, wherein the spin device and the brush element are positioned in the cleaning chamber;

a wafer arm configured to transport the wafer, wherein an opening is formed on the wafer arm;

an exposure chamber secluded from the cleaning chamber;

a wafer chuck device disposed in the exposure chamber;

an exposure device located over the wafer chuck device and configured to emit an energy beam;

an inspection device disposed in the exposure chamber and positioned adjacent to the wafer chuck device, wherein the inspection device is configured to inspect a backside of the wafer and generate an inspection signal, wherein the inspection device inspects the backside of the wafer through the opening of the wafer arm; and a process module configured to generate a control signal according to the inspection signal, wherein the control device is configured to control the brush element or the spin device according to the control signal.

13. The wafer cleaning system as claimed in claim 12, wherein the backside of the wafer has a clear area and an unclear area, and the contaminants are located in the unclear area, wherein a movement speed of the brush element at the unclear area is slower than a movement speed of the brush element at the clear area.

14. The wafer cleaning system as claimed in claim 12, wherein the backside of the wafer has a clear area and an unclear area, and the contaminants are located in the unclear area, wherein a rotational speed of the brush head at the unclear area is greater than a rotational speed of the brush head at the clear area.

15. The wafer cleaning system as claimed in claim 12, wherein the backside of the wafer has a clear area and an unclear area, and the contaminants are located in the unclear area, wherein a rotational speed of the spin device when the brush element is at the unclear area is slower than a rotational speed of the spin device when the brush element is at the clear area.

16. The wafer cleaning system as claimed in claim 12, further comprising a plurality of pins configured to support the wafer, wherein when the wafer is disposed on the pins, the wafer is distant from the spin device.

17. The wafer cleaning system as claimed in claim 12, wherein the wafer arm configured to transport the wafer from a position relative to the inspection device into the cleaning chamber.

18. The wafer cleaning system as claimed in claim 12, wherein the exposure device is positioned relative to an edge of the wafer chuck to emit the energy beam toward the edge of the wafer chuck.

19. The wafer cleaning system as claimed in claim 12, wherein the inspection device comprises a camera configured to capture an image of the backside of the wafer.

* * * * *